under the inventors' names.

United States Patent
Arkun et al.

(10) Patent No.: US 8,455,881 B2
(45) Date of Patent: Jun. 4, 2013

(54) GE QUANTUM DOTS FOR DISLOCATION ENGINEERING OF III-N ON SILICON

(75) Inventors: Erdem Arkun, San Carlos, CA (US); Andrew Clark, Los Altos, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 13/235,544

(22) Filed: Sep. 19, 2011

(65) Prior Publication Data

US 2013/0069039 A1    Mar. 21, 2013

(51) Int. Cl.
    *H01L 29/15* (2006.01)
(52) U.S. Cl.
    USPC .............. 257/76; 257/77; 257/78; 257/613; 257/614; 257/615; 257/616; 257/E29.071
(58) Field of Classification Search
    USPC ...... 257/E29.071, 613–616, 76–78; 438/752, 438/933, 962; 117/936
    See application file for complete search history.

(56) References Cited

U.S. PATENT DOCUMENTS

| 6,177,684 | B1 * | 1/2001 | Sugiyama | 257/17 |
| 8,044,382 | B2 * | 10/2011 | Yokoyama et al. | 257/13 |
| 2002/0013042 | A1 * | 1/2002 | Morkoc | 438/604 |

* cited by examiner

*Primary Examiner* — Steven Loke
*Assistant Examiner* — Cuong Nguyen
(74) *Attorney, Agent, or Firm* — Parsons & Goltry; Robert A. Parsons; Michael W. Goltry

(57) ABSTRACT

A virtual substrate structure includes a crystalline silicon substrate with a first layer of III-N grown on the silicon substrate. Ge clusters or quantum dots are grown on the first layer of III-N and a second layer of III-N is grown on the Ge clusters or quantum dots and any portions of the first layer of III-N exposed between the Ge clusters or quantum dots. Additional alternating Ge clusters or quantum dots and layers of III-N are grown on the second layer of III-N forming an upper surface of III-N. Generally, the additional alternating layers of Ge clusters or quantum dots and layers of III-N are continued until dislocations in the III-N adjacent the upper surface are substantially eliminated.

7 Claims, 1 Drawing Sheet

QD layers of Ge pin dislocations propagating through GaN
This results in a dislocation density reduction in the overall GaN layer.
Higher quality GaN results in improved device performance.

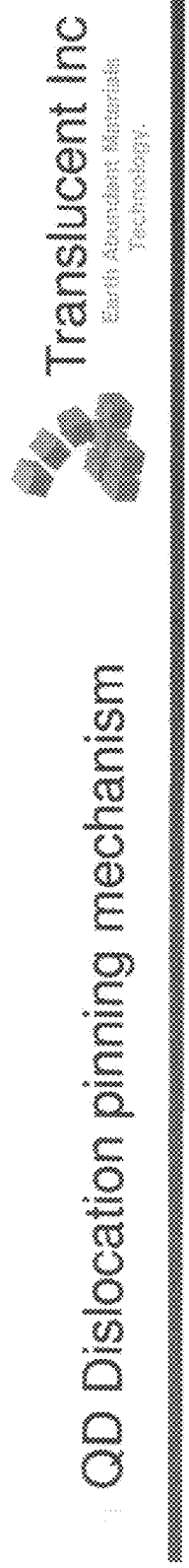

GE QUANTUM DOTS FOR DISLOCATION ENGINEERING OF III-N ON SILICON

FIELD OF THE INVENTION

This invention relates in general to the growth of III-N on silicon and more specifically to the incorporation of Ge quantum dots to reduce overall dislocations in the III-N.

BACKGROUND OF THE INVENTION

Virtual substrates of the type discussed herein are substantially lattice matched layers of III-N semiconductor material, such as GaN, on a silicon substrate (wafer or portion thereof). A key component of this design is to maintain single crystallinity from the substrate to the top of the semiconductor layer. However, it is difficult to grow sufficiently thick layers of III-N directly on silicon because of the dislocations that propagate through the III-N. The growth of III-N on silicon, and in some applications other material such as rare earth oxides, involves the formation of compressive stress into the III-N layer during growth and the compressive stress results in dislocations rather than fractures as in tensile stress.

One prior art method of reducing dislocations in the GaN layer is to treat the GaN with $SiH_4$ during growth. The mechanism for dislocation reduction is the formation of pits by $SiH_4$ etching and overgrowing the pits with GaN. Dislocations in this case change direction and start growing horizontally instead of growing vertically (i.e. parallel to the c-axis).

Various methods have been proposed that incorporate several layers of crystal matching materials between the silicon substrate and the III-N semiconductor layers. One problem with these methods is that each additional layer increases the ultimate cost of the final product. It is desirable, therefore, to grow a III-N semiconductor layer directly on a silicon substrate or rare earth oxide material.

It would be highly advantageous, therefore, to remedy the foregoing and other deficiencies inherent in the prior art.

Accordingly, it is an object of the present invention to provide a new and improved method utilizing quantum dots for dislocation engineering of III-N.

It is another object of the present invention to provide a new and improved method utilizing quantum dots for dislocation engineering of III-N on silicon.

It is another object of the present invention to provide a new and improved virtual substrate structure including III-N grown directly on silicon with reduced dislocation density.

It is another object of the present invention to provide a new and improved virtual substrate structure of III-N grown directly on silicon and including alternating layers of Ge clusters or quantum dots and layers of III-N continued until dislocations in the III-N adjacent the upper surface are substantially eliminated.

SUMMARY OF THE INVENTION

Briefly, to achieve the desired objects and aspects of the instant invention in accordance with a preferred embodiment thereof, provided is a virtual substrate structure including a crystalline silicon substrate with a first layer of III-N grown on the silicon substrate. Ge clusters or quantum dots are deposited on the first layer of III-N and a second layer of III-N is grown on the Ge clusters or quantum dots and any portions of the first layer of III-N exposed between the Ge clusters or quantum dots. Additional alternating Ge clusters or quantum dots and layers of III-N are deposited and grown on the second layer of III-N forming an upper surface of III-N. Generally, the additional alternating layers of Ge clusters or quantum dots and layers of III-N are continued until dislocations in the III-N adjacent the upper surface are substantially eliminated.

The desired objects and aspects of the instant invention are further realized in accordance with a method of fabricating a virtual substrate structure including the steps of providing a crystalline silicon substrate and depositing a first layer of III-N thereon. The method further includes the steps of depositing a first layer of Ge clusters or quantum dots on the first layer of III-N and depositing a second layer of III-N on the first layer of Ge clusters or quantum dots and any portions of the first layer of GaN exposed between the Ge clusters or quantum dots. A second layer of Ge clusters or quantum dots is deposited on the second layer of III-N and a third layer of III-N is deposited on the second layer of Ge clusters or quantum dots and any portions of the first layer of III-N exposed between the Ge clusters or quantum dots. Generally, additional alternating layers of Ge clusters or quantum dots and layers of III-N are continued until dislocations in the III-N adjacent the upper surface are substantially eliminated.

BRIEF DESCRIPTION OF THE DRAWING

The foregoing and further and more specific objects and advantages of the instant invention will become readily apparent to those skilled in the art from the following detailed description of a preferred embodiment thereof taken in conjunction with the drawing in which the single FIGURE illustrates a preferred embodiment of a virtual substrate structure including a GaN semiconductor on a silicon substrate.

DETAILED DESCRIPTION OF THE DRAWING

Referring to the single FIGURE, a preferred virtual substrate structure 10 is illustrated in accordance with the present invention. Structure 10 includes a single crystal silicon substrate 12 which may for example have a <111> upper face for the growth of additional layers. It should be understood however that the present invention is not limited to <111> silicon but that <110> and <100> silicon or variations thereof could also be used. Further, it will be understood that the term "substrate" as used herein can include a simple layer of silicon, preferably, or other material such as a rare earth oxide in some applications. Also, while silicon substrate 12 is illustrated as single crystal pure silicon it should be understood that single crystal substrates composed of materials containing elements other than silicon or in addition to silicon may be used.

In this specific embodiment, a thin layer 14 of single crystal GaN is grown directly on the surface of silicon substrate 12. It should be understood that other III-N materials or combinations thereof could be used throughout this disclosure in place of GaN and the GaN is disclosed as a preferred embodiment. The various layers of structure 10 can be grown by a variety of methods including MBE, MOCVD, PLD (pulsed laser deposition) sputtering, ALD (atomic layer epitaxy), or any other known growth method for thin films. As understood in the art, dislocations, illustrated schematically and designated 16, form in layer 14 because of the mismatching of the crystal lattices between silicon and GaN. By keeping layer 14 very thin (a few nanometers, e.g. 5 nm to 10 nm) fewer dislocations are formed and if layer 14 is increased in thickness the dislocations will continue to propagate vertically through the material resulting in a substantially useless product.

To overcome this problem, a thin layer 18 of material is treated with Ge to form quantum dots. In practice this can be provided by turning off the Ga source and allowing a flow or beam (as in Molecular Beam Epitaxy or MBE) of Ge to impinge on the surface of layer 14 at the growth temperature. A flow or beam of nitrogen/ammonia continues during this process. The Ge introduced into the process forms Ge clusters or quantum dots, designated 20, in layer 18. The quantum dots form a discontinuity in the GaN crystal lattice and act as pinning centers for dislocations 16 in layer 14, as illustrated in the FIGURE. While the term "layer" is used for convenience in this disclosure of a process of introducing Ge clusters or quantum dots 20 into structure 10, it will be understood that Ge clusters or quantum dots 20 are basically simply buried in the GaN so as to act as pinning centers in the GaN. Also, the Ge clusters or quantum dots 20 may not completely cover the underlying layer of GaN so that some portions of the underlying layer may be exposed to the growth of the next layer of GaN.

A second thin layer 22 of GaN is then grown on the surface of layer 18. Growth conditions for the GaN, after the Ge cluster or quantum dot formation, is set such that vertical growth is promoted, after which the process is switched back to lateral growth conditions. There are effectively two mechanisms acting to reduce the dislocation density in the GaN. Ge clusters or quantum dots 20 not only provide a pinning center for dislocations 16 in layer 14 but also promote the overgrowth of GaN, reducing dislocation density in layer 22, as illustrated in the FIGURE.

Layer 22 of GaN is again formed very thin (a few nanometers) to minimize the compressive stress and the formation of further dislocations. Because most or many of the dislocations formed in layer 14 are pinned by Ge clusters or quantum dots 20 in layer 18 very few propagate into layer 22. Also, the overgrowth of GaN promoted by Ge dislocations or quantum dots 20 further reduces dislocation density in layer 22.

After the growth of layer 22, Ge is again introduced into the process to form Ge clusters or quantum dots 20 in a second layer 24. Layer 24 is formed as described above for layer 18. Again, Ge clusters or quantum dots 20 in layer 24 not only provide a pinning center for dislocations 16 in layer 22 but also promote the overgrowth of GaN, reducing dislocation density in a third layer 26, as illustrated in the FIGURE. By alternating the growth of GaN layers and Ge clusters or quantum dots, it will be understood that a relatively thick layer of GaN can ultimately be grown directly on silicon substrate 12 with very few or no dislocations adjacent an upper surface 30. Generally, additional alternating layers of Ge clusters or quantum dots and layers of GaN are continued until dislocations in the GaN adjacent upper surface 30 are substantially eliminated and/or the desired thickness of the GaN is achieved.

While layers 14, 22, and 26 are illustrated as substantially the same thickness and layers 18 and 24 are illustrated with a defined thickness it should be understood that the thickness of the various layers may be altered slightly in at least some applications (e.g. increased thickness from the first to the last layers) because of the reduced dislocations as the process proceeds. It may however, be more convenient to form each layer in accordance with specific and predetermined time and material.

Thus, in the present invention a new and improved method utilizing quantum dots for dislocation engineering of III-N on silicon or rare earth oxide substrates is disclosed. The new and improved method allows the fabrication of a virtual substrate structure including III-N grown directly on a base or substrate layer of silicon or a rare earth oxide. Because the III-N is grown directly on the base or substrate layer, the process is relatively inexpensive and simple to perform.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A virtual substrate structure comprising:
   a substrate layer including one of a crystalline silicon and a crystalline rare earth oxide;
   a first layer of III-N material grown on the substrate;
   Ge quantum dots grown on the first layer of III-N material;
   a second layer of III-N material grown on the Ge quantum dots and any portions of the first layer of III-N material exposed between the Ge quantum dots; and
   additional alternating Ge quantum dots and layers of III-N material grown on the second layer of III-N material forming an upper surface of III-N material.

2. The virtual substrate structure as claimed in claim 1 wherein the additional alternating layers of Ge quantum dots and layers of III-N material are continued until dislocations in the III-N material adjacent the upper surface are substantially eliminated.

3. The virtual substrate structure as claimed in claim 1 wherein at least some of the layers of III-N material include GaN.

4. A virtual substrate structure comprising:
   a crystalline silicon substrate;
   a first layer of III-N material grown on the silicon substrate;
   a first layer of Ge quantum dots grown on the first layer of III-N material;
   a second layer of III-N material grown on the first layer of Ge quantum dots and any portions of the first layer of III-N material exposed between the Ge quantum dots of the first layer of Ge quantum dots;
   a second layer of Ge quantum dots grown on the second layer of III-N material; and
   a third layer of III-N material grown on the second layer of Ge quantum dots and any portions of the second layer of III-N material exposed between the Ge quantum dots of the second layer of Ge quantum dots.

5. The virtual substrate structure as claimed in claim 4 further including additional alternating layers of Ge quantum dots and layers of III-N material grown on the third layer of III-N material.

6. The virtual substrate structure as claimed in claim 4 wherein the first layer of III-N material has a thickness in a range of 5 nm to 10 nm.

7. The virtual substrate structure as claimed in claim 6 wherein the second layer of III-N material has a thickness in a range of 5 nm to 10 nm.

* * * * *